Figure 1:
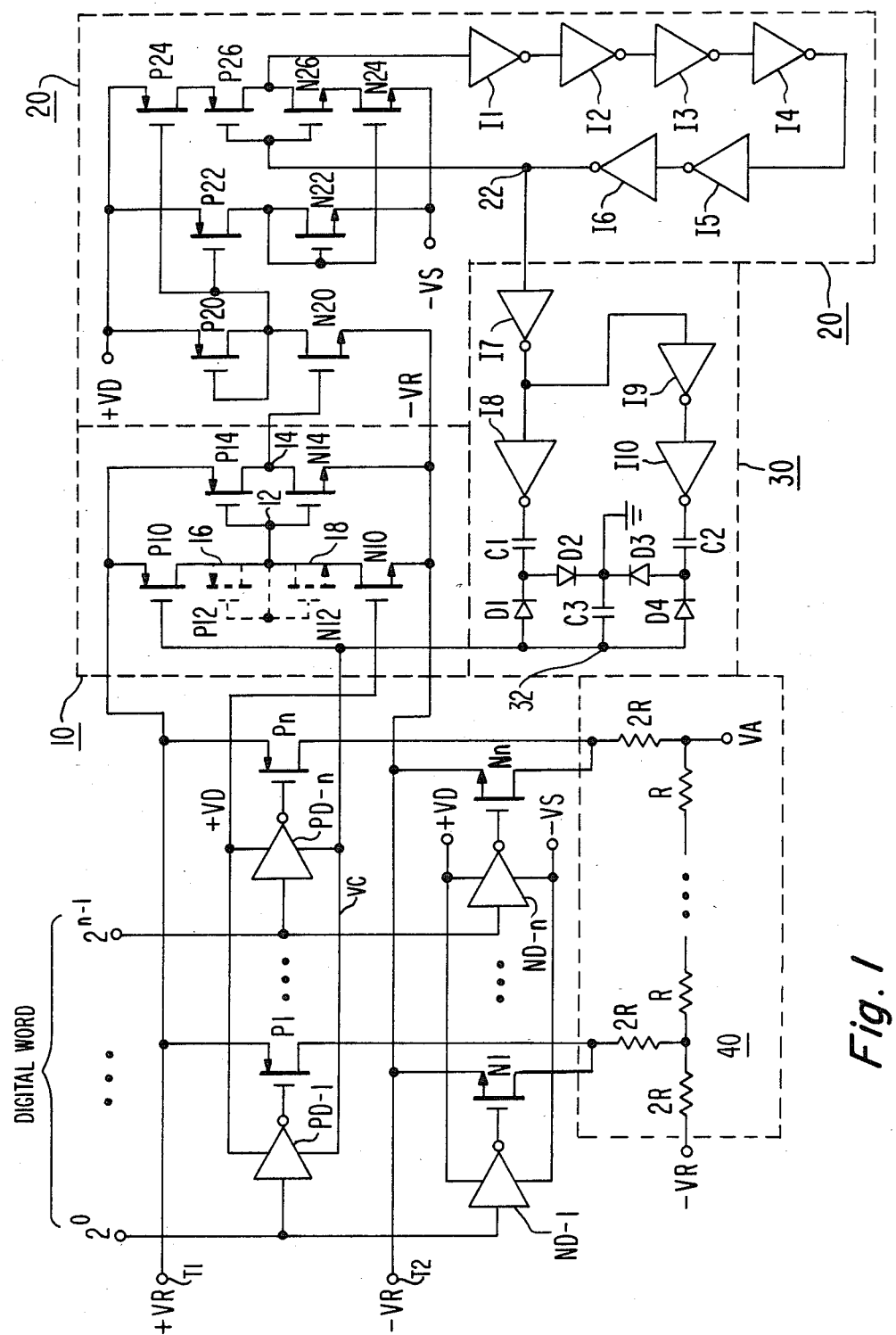

United States Patent [19]
Dingwall et al.

[11] Patent Number: 4,553,132
[45] Date of Patent: Nov. 12, 1985

[54] APPARATUS FOR MATCHING FET SWITCHES AS FOR A VIDEO DIGITAL-TO-ANALOG CONVERTER

[75] Inventors: Andrew G. F. Dingwall, Bridgewater; Victor Zazzu, Montvale, both of N.J.

[73] Assignee: RCA Corporation, Princeton, N.J.

[21] Appl. No.: 460,656

[22] Filed: Jan. 24, 1983

[51] Int. Cl.[4] .............................................. H03K 13/03
[52] U.S. Cl. ............................... 340/347 DA; 307/571
[58] Field of Search ... 340/347 DA, 347 M, 347 AD; 307/448, 451, 571; 330/9, 264, 282, 283

[56] References Cited

U.S. PATENT DOCUMENTS

| | | | |
|---|---|---|---|
| 3,694,760 | 9/1972 | Loessi | 330/9 |
| 3,978,473 | 8/1976 | Pastoriza | 340/347 DA |
| 4,079,308 | 3/1978 | Brown | 323/1 |
| 4,105,950 | 8/1978 | Dingwall | 331/57 |
| 4,142,114 | 2/1979 | Green | 307/304 |
| 4,236,199 | 11/1980 | Stewart | 363/60 |
| 4,297,644 | 10/1981 | Ahmed | 330/264 |
| 4,307,307 | 12/1981 | Parekh | 307/297 |
| 4,307,333 | 12/1981 | Hargrove | 323/313 |
| 4,311,923 | 1/1982 | Lüscher et al. | 307/304 |
| 4,331,892 | 5/1982 | Miskin | 307/448 |
| 4,366,470 | 12/1982 | Takanashi et al. | 340/347 DA |
| 4,381,499 | 4/1983 | Struthoff | 340/347 DA |
| 4,384,274 | 5/1983 | Mao | 340/347 DA |
| 4,492,954 | 1/1985 | Harris et al. | 340/347 DA |

Primary Examiner—Vit W. Miska
Attorney, Agent, or Firm—E. M. Whitacre; P. J. Rasmussen; C. A. Berard, Jr.

[57] ABSTRACT

A digital-to-analog converter includes a plurality of pairs of complementary conductivity field-effect transistors (FETs) coupled for applying reference potentials to a resistive ladder network in response to the bit values of an input digital word. A variable voltage generator develops gate biasing voltage for the FETs of one conductivity. The biasing voltage has a magnitude controlled in response to a bridge circuit including a further pair of complementary conductivity FETs also coupled to the reference potentials. As a result, the complementary conductivity FETs are automatically caused to exhibit matched conductivity characteristics.

18 Claims, 2 Drawing Figures

APPARATUS FOR MATCHING FET SWITCHES AS FOR A VIDEO DIGITAL-TO-ANALOG CONVERTER

The present invention relates generally to apparatus for matching field-effect transistor switches and, in particular, for matching such switches in a digital-to-analog converter (DAC).

Conversion of digital signal words into corresponding analog signal levels is accomplished by applying the respective bit signals of the digital words to various input points of a resistive ladder network. The corresponding analog levels are developed at an output point of the resistive ladder network. Suitable resistive networks are arranged so that the conversion scaling and accuracy is determined by the ratios of the resistive elements which comprise the network. Resistive networks whose accuracy is a function of ratios of values, rather than a function of absolute resistance, are preferred because precise ratios of values are readily obtained in integrated circuit and thick or thin film fabrication technologies whereas precise values of absolute resistance are much more difficult to obtain.

When solid-state switching elements such as field-effect transistors (FETs) are employed, their resistances in the ON condition are not zero and so will affect the resistance ratios obtained and tend to degrade the accuracy of the DAC conversion scaling. One approach to minimize this problem is to increase the physical dimensions of the channels of the transistors which reduces their ON resistance. This approach is disadvantageous in that it substantially increases the size of the integrated circuit DAC thereby increasing its cost and reducing its production yield.

When a DAC is to perform conversions rapidly, such as converting digitized video samples having a 10-20 megahertz (MHz) data rate into analog video signals as in a television receiver including digital video signal processing, it is necessary to employ a ladder network in which the resistances have relatively low absolute values, for example, only several hundred ohms. To increase the dimensions of the FET switches sufficiently that their ON resistances are an insignificant part of the ladder resistances requires FETs having impractically large channel widths. Thus, with practical FET channel widths, it is necessary to match their ON resistances.

In addition, it is impractical to produce FET switches which are sufficiently well matched in ON resistance under differing conditions of operating voltages. This problem arises, for example, where the user of a DAC selects the values of the reference voltages applied to the resistive ladder network by the FET switches. Where positive and negative reference voltages can be used, it is desirable to employ P-channel FETs (PFETs) and N-channel FETs (NFETs) as switches. This increases the difficulty of matching ON resistance because the P-channel FETs (PFETs) are generally not sufficiently well matched to the N-channel FETs (NFETs), even when they are fabricated together on the same integrated circuit, especially where the reference voltages are not known in advance.

Thus, the need exists for means to provide suitable matching between NFETs and PFETs. This need is greater where the FETs experience a range of possible operating conditions and where their ON resistances are not insignificant relative to the resistance of the apparatus to which they connect.

In the present invention, a pair of complementary conductivity field-effect transistors selectively couple a pair of terminals to a utilization device, such as for selectively coupling reference potentials to a resistive network, in response to control signals. A control device includes a further pair of complementary conductivity field-effect transistors connected between the terminals and to a variable generator which develops the control signal applied to ones of the transistors of the pair and of the further pair of field-effect transistors.

IN THE DRAWINGS

Figure 2:
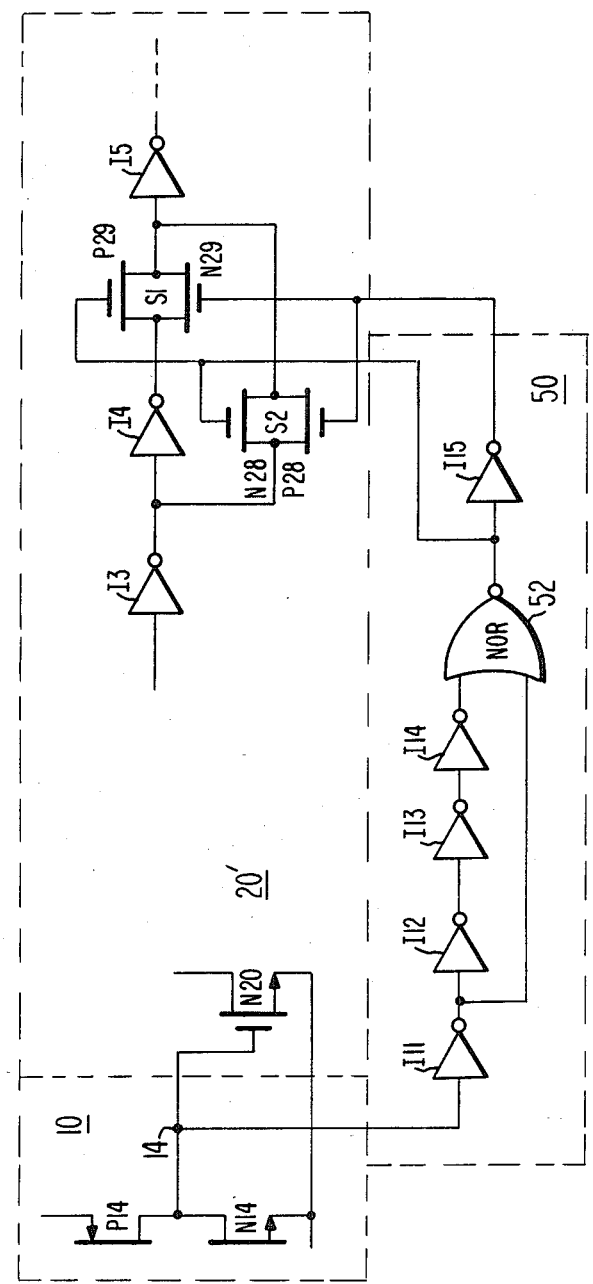

FIG. 1 is a schematic diagram of apparatus including an embodiment of the present invention, and FIG. 2 is a schematic diagram of a modification of the apparatus of FIG. 1.

The digital-to-analog converter (DAC) of FIG. 1 includes an "R-2R" resistive ladder network 40, so called because the resistances are of values R and 2R, i.e., in a one-to-two ratio, where R is a selected value of resistance. Positive reference voltage +VR at terminal T1 is selectively applied to ones of the 2R resistances by PFET switches P1 through Pn, where n is the number of bits in the digital word to be converted. Negative reference voltage −VR at terminal T2 is selectively applied thereto by NFET switches N1 through Nn. Analog signal levels VA corresponding to the value of an input digital word are developed at the output of R-2R ladder network 40. Analog signals VA have magnitudes proportional to the combinations of +VR and −VR reference voltages applied to network 40 via the PFET and NFET switches.

FET N1 becomes conductive to exhibit its ON resistance when operating voltage +VD is applied to its gate by driver ND-1 which is, for example, an inverter including a pair of complementary conductivity FETs. FET N1 becomes nonconductive when ND-1 applies operating voltage −VS to its gate. Similarly, FET P1 becomes conductive to exhibit its ON resistance when driver PD-1 applies control voltage VC to its gate and becomes nonconductive when PD-1 applies +VD to its gate. Drivers ND-1 and PD-1 both receive the $2^0$ weight bit signal (least significant bit) of the digital input word to make either FET P1 or FET N1 conductive in response to the digital value of the $2^0$ bit being a logical "1" or a logical "0", respectively.

The operation of FETs Pn, Nn and drivers PD-n, ND-n in response to the $2^{n-1}$ weight bit signal (most significant bit) is the same as that described in relation to P1, N1 immediately above. FETs and drivers for the intermediate weight bit signals $2^1, 2^2, \ldots, 2^{n-2}$ are similar and are not shown so as to avoid repetitive details which would only needlessly increase the complexity of the FIGURE without increasing the information conveyed.

When the DAC as thus far described is employed to convert eight-bit digital words (n=8) at a conversion rate of 10-20 MHz, the value R for ladder network 40 should be no greater than about 200 ohms. Each of FETs P1 to Pn and N1 to Nn would have to exhibit an ON resistance of about 0.2 ohms or less for that ON resistance to have negligible effect on conversion scaling and accuracy. That ON resistance corresponds to a channel width dimension of about 50,000 microns for a FET fabricated by CMOS processing techniques; i.e., about two inches (5 cm.) wide which is clearly impractically large.

It is preferred, when FET switches having ON resistances which are not insignificant are employed, that the P and N FET switches connected to the same input to ladder network 40 be at least nominally matched to have substantially equal ON resistances. This is accomplished by design when P and N FETS are fabricated on the same integrated circuit by causing their channel widths to be in a given relationship, assuming equal channel lengths. For the CMOS integrated circuit process used by RCA Corporation, this is about a 3:2 ratio of PFET channel width to NFET channel width.

In addition, so that the not insignificant ON resistances of the FETs do not affect the conversion scaling of the R-2R ladder network 40, the relative ON resistances of the PFETs and NFETs are scaled (weighted) in accordance with the weight of the bit signal controlling each PFET-NFET pair. Accordingly, the ON resistances of the FET switches associated with the $2^i$ bit signal is preferably two times that of the FET switches associated with the $2^{i+1}$ bit signal, where i is an integer $0 \leq i \leq n-2$. For example, if the ON resistances of FETs P1 and N1 are assumed to be $R_1$ ohms, then the ON resistances of FETs P2 and N2 (not shown) are $R_1/2$, those of Pn and Nn are $R_1/(2^{n-1})$ and so forth for the binary weighted ladder network 40 described herein.

Because the reference voltages applied to the FET switches can be selected by the user of the DAC, the necessary matching of ON resistances cannot be guaranteed for all operating conditions simply by selection of the physical dimensions of the channels of the PFETs and NFETs. For example, an integrated circuit which can accept $+VR$ between zero and $+5$ volts and $-VR$ between zero and $-3$ volts, may be operated at unsymmetrical voltages such as $+VR=+5$ volts and $-VR=0$ volts, or $+VR=0$ volts and $-VR=-3$ volts. In addition, normal processing variations between the PFETs and NFETs can produce excessive mismatching.

Sufficient matching is provided, however, by control apparatus of FIG. 1 including bridge circuit 10, voltage-controlled oscillator 20 and voltage-to-frequency converter 30 which develop control voltage VC in accordance of a feature of the present invention. Bridge circuit 10 includes PFETs P10, P12 and NFETs N10, N12 coupled in series between the reference voltages $+VR$ and $-VR$. Control voltage $+VD$, which is the voltage applied to the gates of operative NFETs N1 through Nn to make them conductive, is applied to the gate of N10. Control voltage VC, which is the voltage applied via drivers PD-1 through PD-n to the gates of operative PFETs P1 through Pn to make them conductive, is applied to the gate of P10. Thus, P10 and N10 are operated at the same voltages as are the operative FET switches P1-Pn and N1-Nn, respectively. The drains of P10 and N10 are coupled to node 12 by connections 16 and 18, respectively.

The voltage developed at interconnection node 12 is responsive to the relative values of the ON resistances of P10 and N10 which are representative of the ON resistances of the operative FET switches. This is so because they all have channel dimensions selected to nominally match the ON resistances of the FETs of each PFET-NFET pair and are operated at like source and gate voltages and similar drain voltages. FET inverter pair P14, N14, also coupled in series between reference voltages $+VR$ and $-VR$, provide at node 14 an amplified version of the signal at node 12.

Voltage controlled oscillator (VCO) 20 receives the amplified voltage at node 14. Common source amplifier FET N20 produces a drain current responsive to the amplified voltage at 14. PFETs P20, P22 and P24 comprise a current mirror amplifier in which P24 supplies drain current proportional to the N20 drain current to the upper end of FET inverter pair P26, N26. NFETs N22 and N24 comprise a current mirror amplifier in which N22 receives drain current from P22 and N24 supplies drain current proportional to the N20 drain current to the lower end of FET inverter pair P26, N26. FET inverter pair P26, N26 and inverters I1 through I6 are a voltage controlled ring oscillator as described in U.S. Pat. No. 4,105,950 entitled VOLTAGE CONTROLLED OSCILLATOR (VCO) EMPLOYING NESTED OSCILLATING LOOPS which is incorporated by reference herein. The frequency of the oscillator signal at node 22 produced by this oscillator is controlled by the drain currents of P24 and N24 developed as described above.

Frequency-to-voltage converter (FVC) 30 includes inverters I7, I8, I9 and I10 which preferably amplify the oscillatory signal at node 22 sufficiently so that inverters I8 and I10 apply antiphase, substantially square wave signals to capacitors C1 and C2, respectively. C1 and C2 provide a.c. coupling of the antiphase square wave signals to a full-wave rectifying network including diodes D1 through D4 to produce a relatively negative voltage VC at node 32. This relatively negative voltage VC is low-pass filtered by capacitance C3 and is applied as the ON-resistance-controlling voltage VC to the gate of PFET P10 and, via drivers PD-1 through PD-n, to the gates of P1 through Pn.

The arrangement including 10, 20 and 30 of FIG. 1 completes a degenerative feedback loop which actively and automatically adjusts the gate voltages of the PFETs to improve the matching of the respective ON resistances of the operative PFETs and NFETs. That improvement of matching is produced as follows: assuming that the ON resistance of FET P10 of bridge circuit 10 is too large, the voltage at interconnection 12 will be too negative and that at interconnection 14 is too positive. This causes FET N20 to become more conductive thereby increasing its drain current and that of FETs P24 and N24. This increases the frequency of the signal developed at node 22 by VCO 20 and applied to FVC 30. This causes the control voltage VC developed at node 32 by FVC 30 to become more negative to increase the gate-source voltage of FET P10. This causes P10 to become more conductive, thereby reducing its ON resistance which is the desired correction for the assumption that its ON resistance was too large. This correction process causes the desired match to more closely obtain. The correction process is the same if the ON resistance of P10 is assumed to be too small except that the sense of correction is opposite whereby VC becomes less negative and P10 less conductive.

It is noted that the circuitry of bridge circuit 10, VCO 20 and FVC 30 of FIG. 1 operate at relatively low power levels and so do not require FETs of large physical dimensions in an integrated circuit. Therefore, the area required on an integrated circuit for that circuitry is substantially smaller than that which would be required to obtain like accuracy of digital-to-analog conversion solely by increasing the physical dimensions of the operative FET switches.

FIG. 2 is a modification to the apparatus of FIG. 1 for more rapidly correcting control voltage VC. This modification adding speed-up circuit 50 is advantageous when changes in the bit values of the input digital word cause several of the operative PFET switches P1 through Pn to turn on simultaneously thereby tending to reduce VC by discharging capacitance C3. The transient reduction of VC is a positive-going voltage which increases the ON resistance of PFET P10, thereby causing the voltage at node 12 to become relatively more negative and that at node 14 to become relatively more positive. VCO 20 of FIG. 1 will, after some time delay, increase its frequency of oscillation to cause FVC 30 to recharge C3 to restore the control voltage VC to its quiescent level.

Speed-up circuit 50 of FIG. 2 in cooperation with modified VCO 20' operates to reduce the effect on voltage VC caused by the delay introduced by VCO 20. Under quiescent conditions, the voltage at node 14 causes inverter I11 to provide a high output level which is applied to an input of NOR gate 52. Inverters I12, I13 and I14 apply a low level to the other input of NOR gate 52 which provides a low output level. The low output level from NOR gate 52, and the complementary high output level provided by inverter I15 cause switches S1 and S2 of VCO 20' to be closed and open, respectively. Inverters I3, I4 and I5 of VCO 20' are coupled in series as they are in VCO 20. Thus, VCO 20' is functionally identical to VCO 20 in the quiescent condition.

Switches S1 and S2 are, for example, respective pairs of PFETs and NFETs, P28-N28 and P29-N29, having their channels coupled in parallel and receiving complementary drive signals at their respective gates.

When the voltage at node 14 becomes more relatively positive under the transient condition, inverter I11 then provides a low output level. That causes, at least temporarily, both inputs of NOR gate 52 to be at the low level so that NOR gate 52 now provides a high output level. That high output level persists until the low output level from I11 propogates through inverters I12, I13 and I14 to then apply a high level to one input of NOR gate 52, whereupon it produces a low output level. Thus, the transient condition produces a temporarily high output level (speed-up pulse) from NOR gate 52 having a duration determined by the propogation delays of I12-I14, i.e., about 12-15 nanoseconds.

The complementary output levels from NOR gate 52 and inverter I5 cause S1 and S2 to become open and closed, respectively, for the 12-15 nanosecond propogation delay time, and to thereafter revert to being closed and open, respectively. Because the input and output levels of inverter I4 of VCO 20' are complementary levels, the switching of S1 and S2 cause the input of inverter I5 to receive a level transition at each of the beginning and end of the 12-15 nanosecond speed-up pulse. These transitions propogate through inverters I5 and I6 of VCO 20' and to FVC 30 via node 32. This causes FVC 30 to produce two antiphase transitions coupled via C1 and C2 to restore some of the charge to C3 thereby increasing VC.

The speed-up circit 50 is particularly advantageous where the current drawn from capacitor C3 by the gates of PFETs P1 through Pn and drivers PD-1 through PD-n is extremely low so that VCO 20' oscillates at so very low a frequency as to be nearly off. This is so because the response time of a VCO to reach a given frequency increases directly as the change of frequency necessary to reach the given frequency increases.

Modifications are contemplated to the present invention which is limited only by the claims following. For example, where a suitable negative operating voltage is available, the variable voltage generator described to include VCO 20 and FVC 30 can be replaced by an amplifier having sufficiently high gain to maintain control voltage VC with acceptable accuracy.

It is satisfactory that digital weighting schemes other than the straight binary weighting specifically described herein be used. This is conveniently accomplished by providing appropriate resistance ratios in ladder network 40 as is known to those skilled in the art. Further, in accordance with one aspect of the present invention, the operative FET switch pairs are scaled in dimension to exhibit ON resistances substantially in accordance with the weights of the bit signals of the digital word.

Further, the drain-source operating voltages of FETs P10 and N10 can be reduced by removing connections 16 and 18 and substituting diode-connected FETs P12 and N12 (shown in phantom) therefor.

What is claimed is:

1. Apparatus for converting binary digital values, each consisting of a plurality of binary bit values, to analog levels, comprising:
   a source of first and second reference potentials;
   means for applying a first control potential;
   a resistive network having a plurality of input terminals each corresponding to a respectively different one of the binary bit values of said binary digital values and having an output terminal for providing analog levels representing said binary digital values;
   a plurality of first field-effect transistors of a first conductivity type having respective gate electrodes and conductive channels for selectively coupling said first reference potential to respective ones of the input terminals of said resistive network, the conductivity of the channel of each transistor being controllable in response to said first control potential applied to its gate electrode;
   a plurality of second field-effect transistors of a second conductivity type complementary to said first conductivity type having respective gate electrodes and conductive channels for selectively coupling said second reference potential to respective ones of the input terminals of said resistive network, the conductivity of said channel of each transistor being controllable in response to a second control potential applied to its gate electrode;
   means for developing said second control potential including:
      bridge circuitry coupled to said first and second reference potential applying means and responsive to said first and second control potentials for developing a signal indicative of the relative conductivities of the respective channels of said first and second field-effect transistors; and
      variable voltage generating means responsive to the signal provided by said bridge means for developing a variable potential for application as said second control potential to adjust the conductivity the channels of said second field-effect transistors to achieve a desired relationship between the conductivities of the corresponding channels of said first and second field-effect transistors; and means coupled to said means for applying said first control potential and to said means for developing said second control potential and responsive to the binary bit values of said binary digital values for selectively applying said respective first and second control potentials to the gate electrodes of corresponding ones of said first and second field-effect transistors.

2. The apparatus set forth in claim 1 wherein said bridge circuit comprises:

a third field-effect transistor of said first conductivity type having a gate electrode and a conductive channel for coupling said first reference potential to a node, the channel of said third transistor having a conductivity that is controllable in response to said first control potential applied to the gate electrode of said third field-effect transistor;

a fourth field-effect transistor of said second conductivity type having a gate electrode and a conductive channel for coupling said second reference potential to said node, the channel of said fourth transistor having a conductivity that is controllable in response to said second control potential applied to the gate electrode of said fourth field-effect transistor; and means coupled to said node for applying the signal developed thereat to said variable voltage generating means.

3. The apparatus of claim 1 wherein said means responsive to the binary bit values of said digital values for applying said first and second control potentials to the gate electrodes of said respective first and second transistors comprises:

a plurality of first driving means, each for driving a corresponding one of said first field-effect transistors and each having an output terminal coupled to the gate electrode of said corresponding first transistor, an input terminal coupled to receive a binary bit value a first supply terminal coupled to receive said first control potential as a first operating potential and a second supply terminal coupled to receive a second operating potential;

a plurality of second driving means, each for driving a corresponding one of said second field-effect transistors and each having an output terminal coupled to the gate electrode of said corresponding second transistor, an input terminal coupled to receive a binary bit value a first supply terminal coupled to receive said first control potential as a first operating potential and a second supply terminal coupled to receive said second control potential as a second operating potential.

4. The apparatus set forth in claim 2 further comprising:

a fifth field-effect transistor of said first conductivity type having a conductive channel coupled between the conductive channel of said third transistor and said node and having a gate electrode coupled to said node for controlling the conductivity of the channel of said fifth transistor; and a sixth field-effect transistor of said second conductivity type having a conductive channel coupled between the conductive channel of said fourth transistor and said node and having a gate electrode coupled to said node for controlling the conductivity of the channel of said sixth transistor.

5. The apparatus of claim 1 wherein the first and second field effect transistors corresponding to each of said binary bit values exhibits channel conductivity having a value weighted substantially in accordance with the significance of said corresponding binary bit value in said binary digital value.

6. The apparatus of claim 1 wherein said variable voltage generating means comprises:

oscillating means for producing a frequency signal having a frequency controlled in response to the signal developed by said bridge circuitry, and frequency-to-voltage converting means for developing said variable potential having a magnitude controlled in response to said frequency.

7. The apparatus of claim 6 wherein said frequency-to-voltage converting means includes:

rectifying means for providing a unidirectional conduction path between its input and output terminals;

a.c. coupling means for coupling said frequency signal to the input terminal of said rectifying means; and means for storing the potential developed at the output of said rectifying means to provide said variable potential.

8. The apparatus of claim 6 further including amplifying means interposed between said bridge circuitry and said oscillating means for amplifying the signal provided by said bridge circuitry.

9. The apparatus of claim 8 wherein said amplifying means includes:

a first amplifying field-effect transistor of said first conductivity type having a conductive channel coupled between respective first and second electrodes and having a gate electrode for controlling the conductivity thereof, said first electrode being coupled to said source of first reference potential;

a second amplifying field effect transistor of said second conductivity type having a conductive channel coupled between respective first and second electrodes and having a gate electrode for controlling the conductivity thereof, said first and second electrodes of said second amplifying transistor being coupled to said source of second reference potential and to the second electrode of said first amplifying transistor, respectively;

means for applying the signal provided by said bridge circuitry to the gate electrode of at least one of said first and second amplifying field-effect transistors; and means for coupling the interconnected second electrodes of said first and second amplifying field-effect transistors to said oscillating means to supply said amplified signal thereto.

10. The apparatus of claim 6 wherein said oscillating means comprises:

at least one inverter having an input terminal and an output terminal;

switching means for alternately coupling one of said input and said output terminals to a node in response to a control signal; and means responsive to the signal provided by said bridge circuitry for generating said control signal to couple said input terminal to said node for a predetermined time.

11. Apparatus comprising:

means for applying first and second signals;

means for applying a first control potential;

means having an input terminal for utilizing signals applied thereto;

a first field-effect transistor of a first conductivity type having a gate electrode and a conductive channel for applying said first signal to said utilizing means, the conductivity of said channel being controllable in response to said first control potential applied to said gate electrode;

a second field-effect transistor of a second conductivity type complementary to said first conductivity type, having a gate electrode and a conductive channel for applying said second signal to said utilizing means, having a conductivity that is controllable in response to a second control potential applied to the gate electrode of said second field-effect transistor; and means for developing said second control potential including:

bridge circuitry coupled to said first and second signal applying means and responsive to said first and second control potential for developing a signal indicative of the relative conductivities of the respective channels of said first and second field-effect transistors; and variable voltage generating means responsive to the signal provided by said bridge circuitry for developing a variable potential for application as said second control potential to adjust the conductivity of the channel of said second field-effect transistor to obtain a desired relationship between the conductivities of the respective channels of said first and second field-effect transistors.

12. The apparatus set forth in claim 11 wherein said bridge circuitry comprises:

a third field-effect transistor of said first conductivity type having a gate electrode and a conductive channel for coupling said first signal to a node, the channel of said third transistor having a conductivity that is controllable in response to said first control potential applied to the gate electrode of said third field-effect transistor;

a fourth field-effect transistor of said second conductivity type having a gate electrode and a conductive channel for coupling said second signal to said node, the channel of said fourth transistor having a conductivity that is controllable in response to said second control potential applied to the gate electrode of said fourth field-effect transistor; and means coupled to said node for applying the signal developed thereat to said variable voltage generating means.

13. The apparatus set forth in claim 12 further comprising:

a fifth field-effect transistor of said first conductivity type having a conductive channel coupled between the conductive channel of said third transistor and said node and having a gate electrode coupled to said node for controlling the conductivity of the channel of said fifth transistor; and a sixth field-effect transistor of said second conductivity type having a conductive channel coupled between the conductive channel of said fourth transistor and said node and having a gate electrode coupled to said node for controlling the conductivity of the channel of said sixth transistor.

14. The apparatus of claim 11 wherein said variable voltage generating means comprises:

oscillating means for producing a frequency signal having a frequency controlled in response to the signal developed by said bridge circuitry, and frequency-to-voltage converting means for developing said variable potential having a magnitude controlled in response to said frequency.

15. The apparatus of claim 14 wherein said frequency-to-voltage converting means includes rectifying means for providing a unidirectional conduction path between its input and output terminals;

a.c. coupling means for coupling said frequency signal to the input terminal of said rectifying means; and means for storing the potential developed at the output of said rectifying means to provide said variable potential.

16. The apparatus of claim 14 further including amplifying means interposed between said bridge circuitry and said oscillating means for amplifying the signal provided by said bridge circuitry.

17. The apparatus of claim 16 wherein said amplifying means includes:

a first amplifying field-effect transistor of said first conductivity type having a conductive channel coupled between respective first and second electrodes and having a gate electrode for controlling the conductivity thereof, said first electrode being coupled to the means for applying said first signal;

a second amplifying field-effect transistor of said second conductivity type having a conductive channel coupled between respective first and second electrodes and having a gate electrode for controlling the conductivity thereof, said first and second electrodes of said second amplifying transistor being coupled to the means for applying said second signal and to the second electrode of said first amplifying transistor respectively;

means for applying the signal provided by said bridge circuitry to the gate electrode of at least one of said first and second amplifying field-effect transistors; and means for coupling the interconnected second electrodes of said first and second amplifying field-effect transistors to said oscillating means to supply said amplified signal thereto.

18. The apparatus of claim 14 wherein said oscillating means comprises:

at least one inverter having an input terminal and an output terminal;

switching means for alternately coupling one of said input and said output terminals to a node in response to a control signal; and means responsive to the signal provided by said bridge circuitry for generating said control signal to couple said input terminal to said node for a predetermined time.

* * * * *